(12) United States Patent
Lin et al.

(10) Patent No.: US 7,685,667 B2
(45) Date of Patent: Mar. 30, 2010

(54) POST-CMP CLEANING SYSTEM

(75) Inventors: Bih-tiao Lin, Hsin-Chu (TW); Jin Lung Linh, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 1148 days.

(21) Appl. No.: 11/152,560

(22) Filed: Jun. 14, 2005

(65) Prior Publication Data
US 2006/0277702 A1   Dec. 14, 2006

(51) Int. Cl.
*B08B 11/00* (2006.01)
*B08B 11/02* (2006.01)

(52) U.S. Cl. ................ 15/77; 15/88.2; 15/88.3; 15/102

(58) Field of Classification Search ............... 15/77, 15/88.2, 88.3, 102
See application file for complete search history.

(56) References Cited

U.S. PATENT DOCUMENTS 5,636,401 A * 6/1997 Yonemizu et al. ............. 15/77
7,377,002 B2 * 5/2008 Yudovsky et al. ............. 15/77

* cited by examiner

*Primary Examiner*—Randall Chin
(74) *Attorney, Agent, or Firm*—K&L Gates LLP

(57) ABSTRACT

A method and system for cleaning the wafer after CMP is disclosed. A brush module having at least two brushes placed adjacent to each other and having the wafer placed in between. A dummy roller is in contact with an edge of the wafer and follows a rotation of the wafer, wherein when the wafer is rotated, the brushes clean both sides of the wafer, and the dummy roller detects a rotation speed and a rotation direction of the wafer for adjusting the rotation of the wafer.

12 Claims, 7 Drawing Sheets

POST-CMP CLEANING SYSTEM

BACKGROUND

The present invention relates generally to an improved system for cleaning wafers after going through chemical mechanical polish (CMP).

During manufacturing stages of an integrated circuit (IC), chemical mechanical polish (CMP) is commonly used for removing any unnecessary materials. CMP is considered to be a unique fabrication process, because a wafer is deliberately introduced into an environment with a high particle count. During the CMP process, a polishing slurry that is full of abrasive particles in the nanometer to micrometer scale is used. Once the wafer has finished polishing, work must be done to carefully remove those particles from the wafer surface or they will affect the further fabrication steps.

In order to remove those particles from the wafer surface, such that the possibility of defects can be minimized, a cleaning process, typically referred to as post-CMP cleaning, is necessary. After CMP, the wafer must be kept wet prior to cleaning because once the slurry is allowed to dry on the wafer, it becomes hard to remove. Due to electrostatic attraction forces, a simple water rinse may remove little, if any, of these particles after polishing. Consequently, conventional systems using a set of wafer brush cleaners were developed to clean and dry the wafer after CMP. These conventional systems typically use a set of PVA brushes to mechanically wipe the surfaces of the wafer and remove the abrasive particles. In the conventional systems, the wafer is typically cleaned by placing the wafer between a pair of spinning PVA brushes while the wafer itself is being rotated by a set of roller caps which are placed on the bottom of a brush module. The wafer in the brush module has forces exerted on it in two directions: one is exerted by the pair of rotating PVA brushes; the other is applied by the rotating roller caps. A friction force is exerted on the surface of the wafer by the pair of PVA brushes as they scrub in the down direction. This force will push and press the wafer down to contact the roller caps. Other tangent forces are applied by the rotating roller caps at the bottom of the brush module to make the wafer rotate by itself. These tangent forces must be greater than the friction force on the wafer surface exerted by the PVA brushes. Otherwise, the wafer will not rotate smoothly, and may stop at any time, thereby causing the slurry to reside in a certain area. This defect is known as a fan type defect. Since no tools are implemented in such a conventional system to measure the rotation speed and direction of the wafer and PVA brushes, fan type defects and an unstable etch rate can occur during the post-CMP cleaning process, thereby lowering the yield and efficiency in reducing defects.

It is therefore desirable to have a new improved system for post-CMP cleaning such that the yield and efficiency can be improved and that the abnormal wafer recovery success rate may be increased.

SUMMARY

In view of the foregoing, this invention provides an improved system used for post-CMP cleaning of wafers for defect reduction.

In one embodiment of the present invention, a brush module is included having at least two brushes placed adjacent to each other and having the wafer placed in between. A dummy roller is in contact with an edge of the wafer and follows a rotation of the wafer, wherein when the wafer is rotated, the brushes clean both sides of the wafer, and the dummy roller detects a rotation speed and a rotation direction of the wafer for adjusting the rotation of the wafer.

The construction and method of operation of the invention, however, together with additional objects and advantages thereof, will be best understood from the following description of specific embodiments when read in connection with the accompanying drawings.

DESCRIPTION

The following will provide a detailed description of an improved system for cleaning a wafer after going through a chemical mechanical polish (CMP) process to reduce defects and to improve reliability and efficiency.

Figure 1:
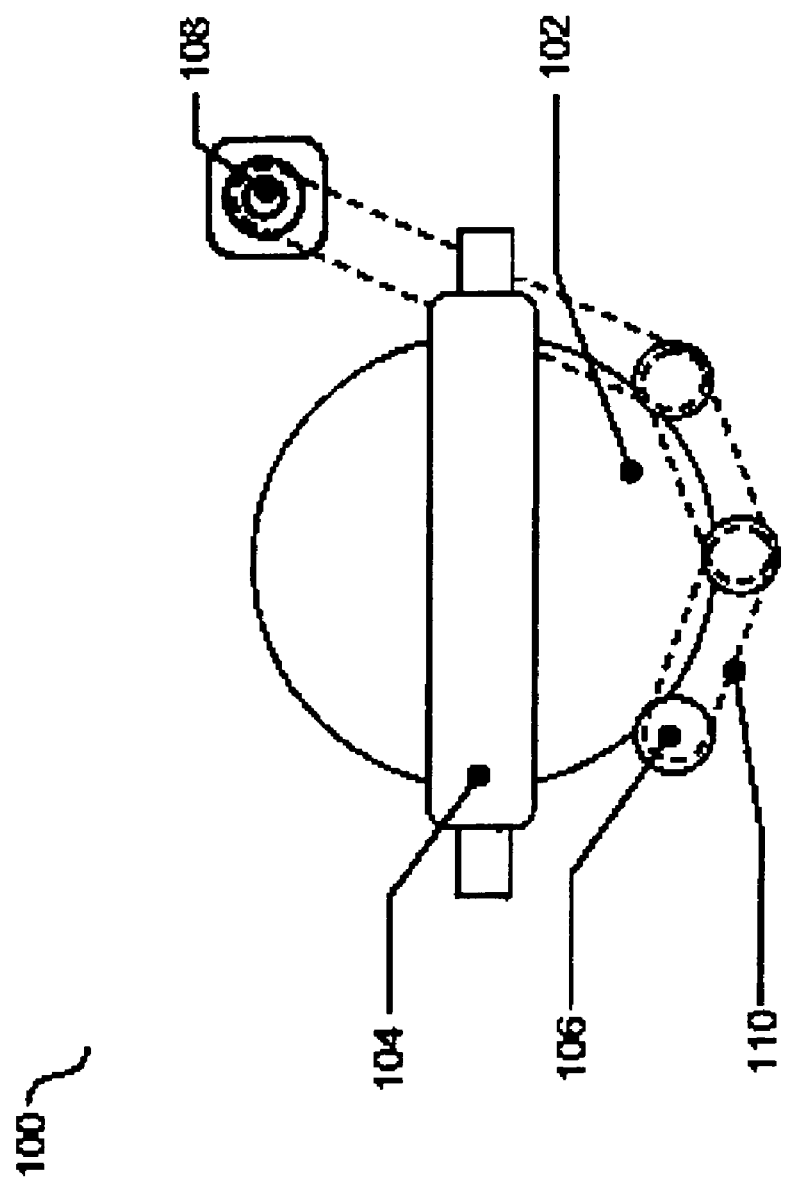
FIG. 1 illustrates a conventional system designed for cleaning a wafer after going through a CMP process.

FIG. 1 is a diagram 100 of a conventional system designed for cleaning a wafer after going through a CMP process. The diagram 100 shows a front view of a brush module. The brush module within the diagram 100 is a vertical system. In other words, a wafer 102 is held upright between two PVA brushes 104 to be cleaned by the rotating brushes. Since the diagram 100 only shows the front view of the brush module, only one of the two PVA brushes 104 is shown in the diagram 100. The wafer 102 is rotated by a set of roller caps 106, which are controlled by a roller motor 108 via a timing belt 110. In the diagram 100, the roller motor 108, the timing belt 110, and the roller caps 106 all turn in a same direction, thereby causing the wafer 102 to rotate in an opposite direction. As the wafer 102 rotates, the PVA brushes 104 are designed to spin and clean off all defects on both sides of the wafer 102.

As mentioned, the tangent force on the wafer 102 applied by the roller caps 106 has to be greater than the friction force on the wafer surface exerted by the brushes 104; otherwise, the wafer 102 cannot rotate smoothly or can even stop, and it would cause a fan-type defect in the wafer 102, resulting in an unstable etch rate. However, since the conventional system is a vertical system, the rotation of the wafer 102 may not be detected easily. The rotation of the PVA brushes 104 also cannot be detected in the conventional method. Without such measurements and corresponding adjustments, defects such as a fan-type defect and an unstable etch rate can occur.

Figure 2A:
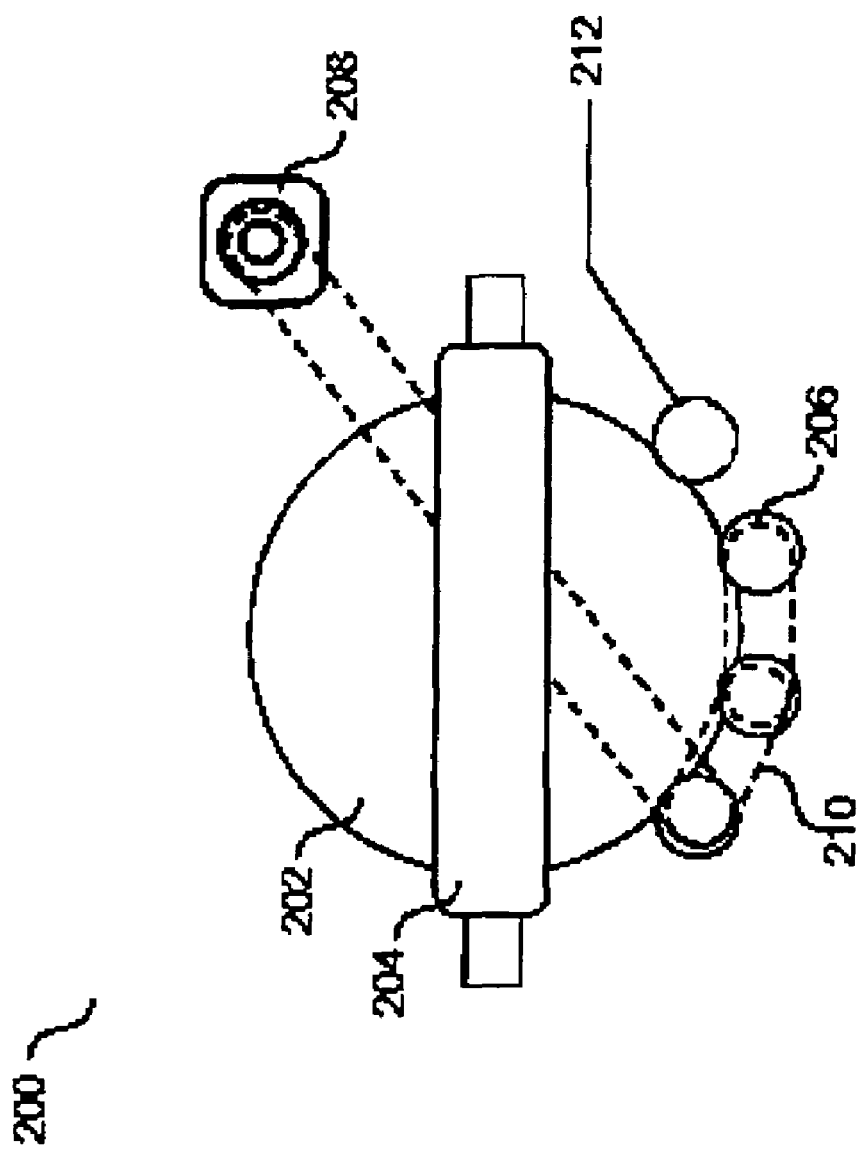
FIG. 2A illustrates a vertical-type brush module used for cleaning a wafer after going through a CMP process in accordance with one embodiment of the present invention.

FIG. 2A is a diagram 200 showing a vertical-type brush module used for cleaning a wafer after going through a CMP process in accordance with one embodiment of the present invention. Since the brush module within the diagram 200 is a vertical system, a wafer 202 is held upright between two PVA brushes 204 to be cleaned by the rotating brushes. It is understood that since this is a front view, one of the PVA brushes 204 is hidden behind the wafer 202 because both "faces" of the wafer 202 are to be cleaned. The wafer 202, much like the wafer 102 of FIG. 1, is rotated by a set of roller caps 206 that are controlled by a roller motor 208 via a timing belt 210. The combination of the set of roller caps 206, the roller motor 208 and the timing belt 210 can be seen as a means for rotating the wafer. A dummy roller 212 equipped with a set of optical sensors is implemented along with the roller caps 206 to determine rotation speed and direction of the wafer 202. The dummy roller 212 can provide feedback so the wafer rotation status can be measured in real time. As shown, the dummy roller 212 is not connected to the timing belt 210 such that it can only be turned if the wafer 202 rotates. In the diagram 200, since the roller motor 208, the timing belt 210, and the roller caps 206 all turn in the same direction, the wafer 202 rotates in a direction opposite to that direction. Because of the rotation of the wafer 202, the dummy roller 212 will also turn in the same direction as the roller caps 206. As the wafer 202 rotates, the PVA brushes 204 are designed to spin and clean off all defects on both sides of the wafer 202.

Note that the start torque of the dummy roller 212 needs to be minimized in order to make an accurate measurement of the wafer rotation. For this purpose, a set of high-speed bearings is used in this embodiment, while the materials and the shape of the bearing shafts are also changed to stainless steel. This allows the inertia of the dummy roller 212 to decrease to 10% and the start torque to decrease to about 5%. The placement location of the dummy roller 212 is also important since the brush module operates at best when the normal force applied on the dummy roller 212 is the largest. Since the friction force exerted on the wafer surface by the PVA brushes 204 is downward and the tangent force applied by the roller caps 206 is in a horizontal direction, a combination force will be directed in the lower right hand direction. Therefore, the best placement location for the dummy roller 212 is in the lower right hand corner as shown in the figure. By using the high speed bearings, the light-start-torque shafts, and the perfect positioning of the dummy roller, the safety margin and reliability of the operation can be improved.

Figure 3:
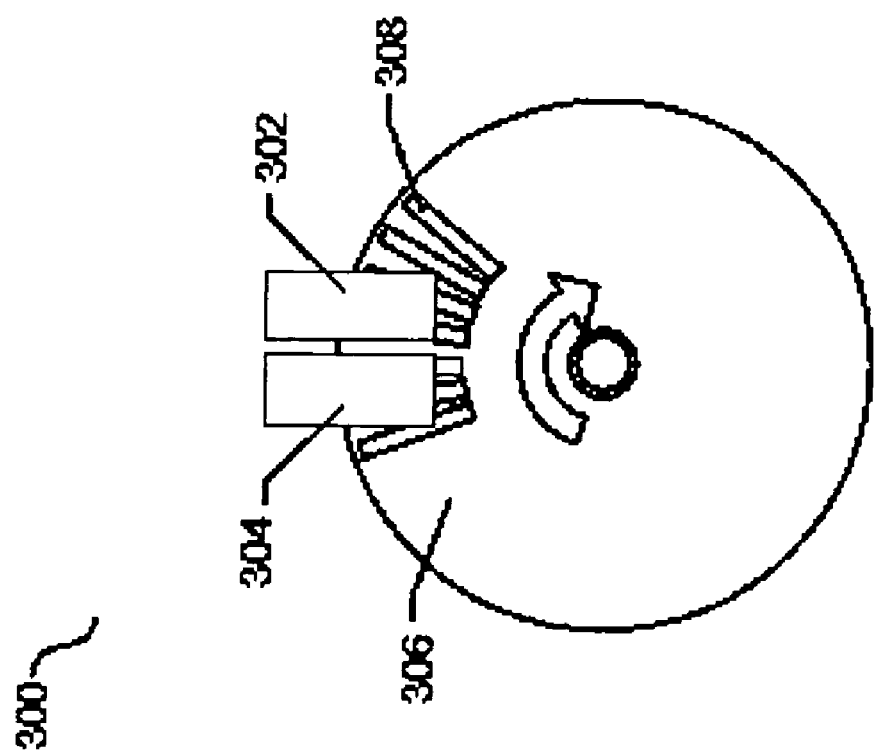
FIG. 3 illustrates an optical encoder that can be implemented on a dummy roller for making rotation speed and direction measurements of a wafer in accordance with one embodiment of the present invention.

In order for the dummy roller 212 to make accurate measurements of the rotation speed and direction of the wafer 202, implementation of a means for detecting rotation speed and direction, which will be introduced in FIG. 3, is required.

Figure 2B:
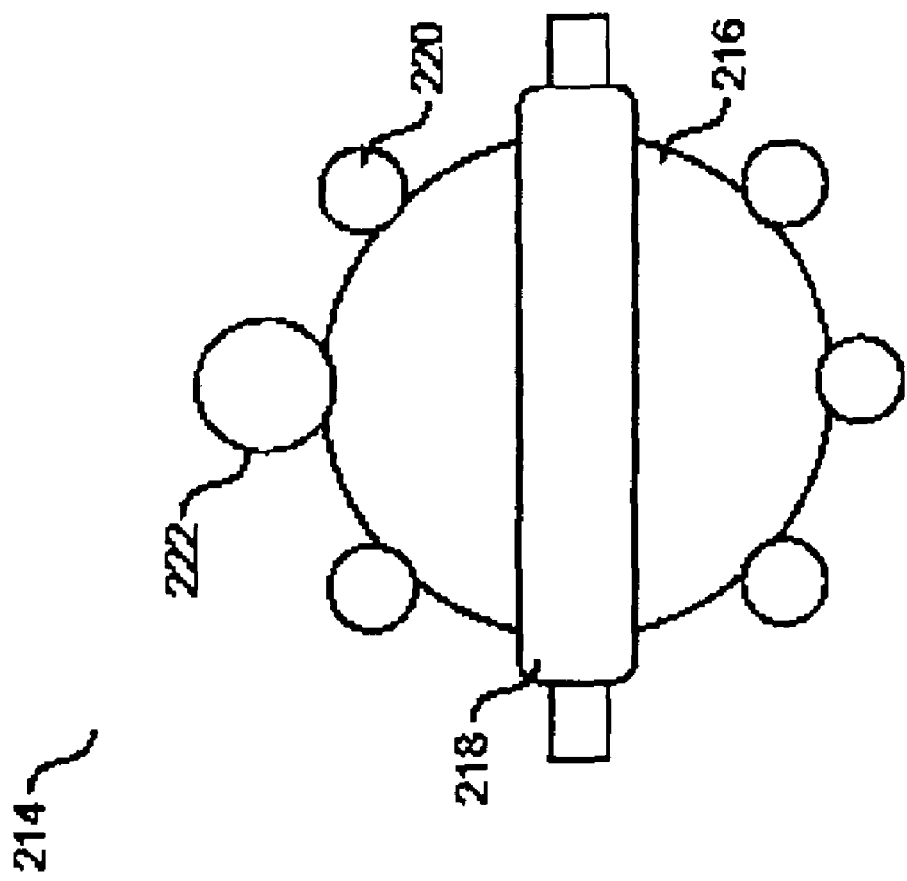
FIG. 2B illustrates a horizontal-type brush module used for cleaning a wafer after going through a CMP process in accordance with one embodiment of the present invention.

FIG. 2B is a diagram 214 showing a horizontal-type brush module used for cleaning a wafer after going through a CMP process in accordance with one embodiment of the present invention. This horizontal system is designed such that a wafer 216 is laid flat and cleaned by a PVA brush 218 that is placed above the surface of the wafer 216. The wafer 216 is rotated by a set of roller caps 220 which are placed all around the wafer. Like the vertical systems shown in FIGS. 1 and 2A, various roller caps 220 are used to turn the wafer 216, and it is contemplated that they be controlled by a roller motor via a timing belt, which are not shown in the figure. A dummy roller 222 is implemented in between two of the roller caps 220 to help determine the rotation speed of the wafer 216.

Like the vertical system shown in FIG. 1A, the rotation speed and direction of the wafer 202 can be determined accurately by using the dummy roller 222 along with a set of optical sensors that will be introduced in FIG. 3. With accurate rotating speed and direction measurements, the yield, efficiency, and the success rate of defect reduction can be improved.

FIG. 3 illustrates an example of a means for detecting the rotation speed and direction of the wafer. As shown, an optical encoder 300 can be implemented with the dummy roller 212 of FIG. 2A or the dummy roller 222 of FIG. 2B for making rotation speed and direction measurements of a wafer in accordance with one embodiment of the present invention. By implementing optical encoder 300 with a dummy roller, accurate measurements of rotation speed and direction for the wafer within the brush module can be taken. The optical encoder 300 is composed of two optical sensors 302 and 304 that are placed above a light interdict plate 306. The light interdict plate 306 is attached to one side of the dummy roller so that when the dummy roller turns, the light interdict plate 306 rotates as well. The optical sensors 302 and 304 operate by bouncing light onto the rotating light interdict plate 306 and sensing a return signal. In order for the optical sensors 302 and 304 to be able to determine if the light interdict plate 306 is rotating, a set of trenches 308 is etched onto the surface of the light interdict plate 306 precisely so that each trench 308 is separated by the same distance. The optical sensors 302 and 304 are also designed to be 90 degrees off-phase in order to detect the rotation speed and direction. As the dummy roller rotates, the optical sensors 302 and 304 will detect light bouncing off the light interdict plate 306 to provide necessary information for a controller to analyze. For the controller, the frequency will determine the rotation speed, while the sign of the frequency indicates the rotation direction.

Figure 4A:
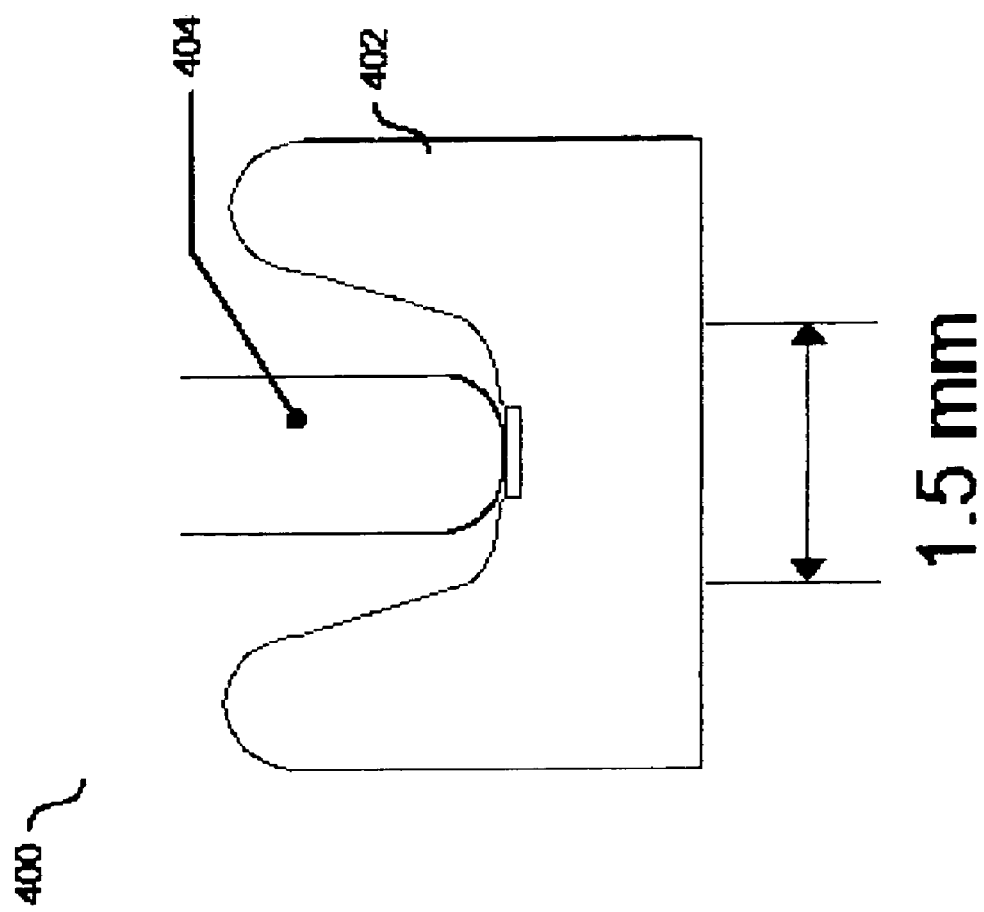
FIG. 4A illustrates a contact area between the edge of a wafer and the trench of a conventional roller cap.

FIG. 4A is a diagram 400 showing a contact area between the edge of a wafer and the trench of a conventional roller cap. As explained in FIGS. 2A and 2B, during the post-CMP cleaning process, a wafer is rotated in a brush module by a set of roller caps that are controlled by a roller motor via a timing belt. In the diagram 400, a vertical view of a roller cap 402 is presented with the edge of a wafer 404 inside the trench of the roller cap 402. The trench width of the roller cap 402 is approximately 1.5 mm which is much larger than the width of a typical wafer such as the wafer 404. Because of this difference in width, the contact area (shown at the "valley" of the trench between the trench of the roller cap 402 and the edge of the wafer 404 may be less than desired. With such small contact area, the possibility of error in rotating the wafer is much higher.

Figure 4B:
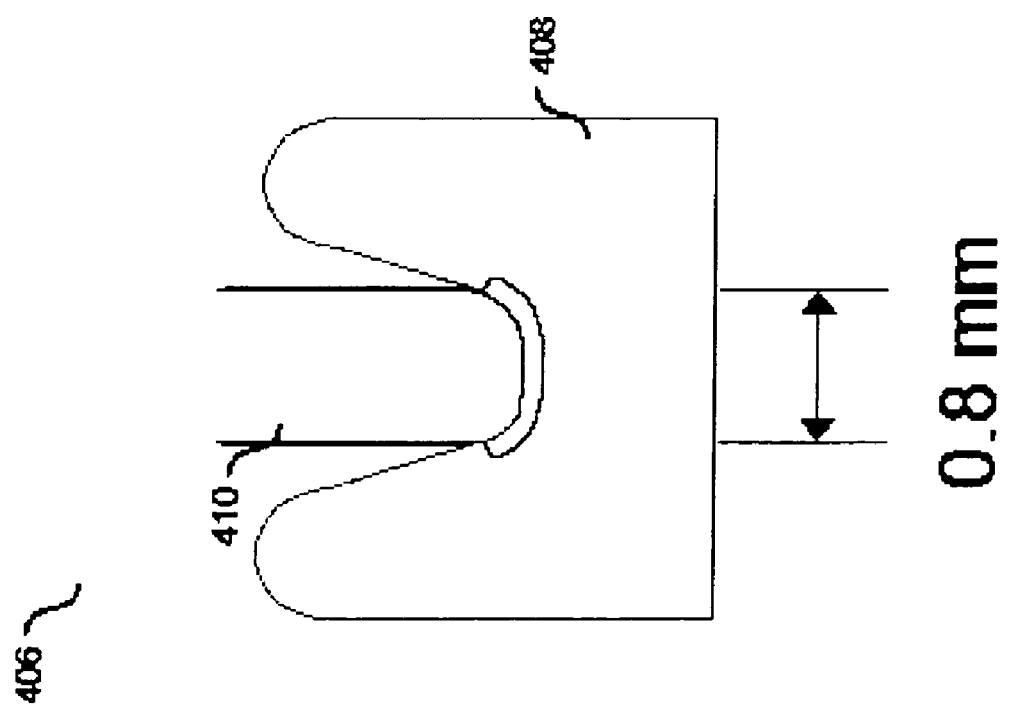
FIG. 4B illustrates an improvement that is made to the conventional roller caps used for rotating the wafer in a brush module in accordance with one embodiment of the present invention.

FIG. 4B is a diagram 406 showing an improvement that is made to the conventional roller caps used for rotating the wafer in a brush module in accordance with one embodiment of the present invention. For the conventional roller cap 402 shown in FIG. 4A, it has a trench approximately 1.5 mm wide for the wafer 404 to rotate on even though the wafer 404 is much thinner than the width of the trench of roller cap 402. The diagram 406 shows an improved design of the roller caps that can be used for rotating the wafer by simply making the trench of a roller cap narrower, allowing a better fit for the wafer. The width of the trench is reduced to be about the thickness of the wafer plus an additional space for keeping the wafer rotating. The additional space provided is determined by the smoothness of the wafer rotation. As long as the rotation of the wafer is not interfered, the width of the trench should be kept at a minimum. For example, a roller cap 408 can have a trench width of around 0.8 mm, close to half the width of the trenches of the roller caps used in conventional methods. This allows the roller cap 408 to have much more contact area with the edge of the wafer 410. With the new roller caps, the contact surface can be increased by 200% compared with the conventional method, thereby reducing the margin of error while improving the reliability of operation.

Figure 5:
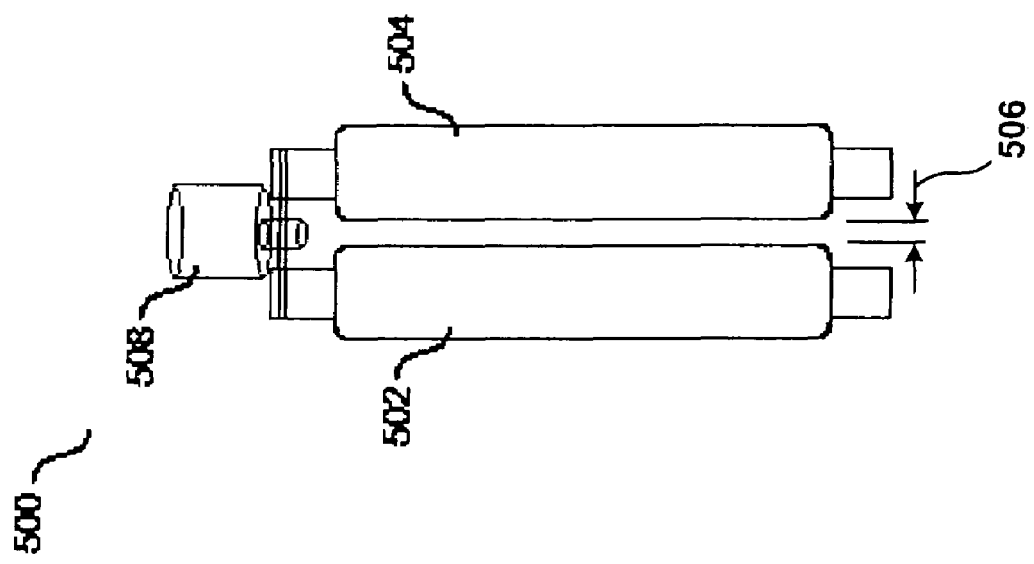
FIG. 5 is a diagram showing a pair of adjustable PVA brushes used for post-CMP cleaning of a wafer in accordance with one embodiment of the present invention.

FIG. 5 illustrates a diagram 500 showing a pair of adjustable PVA brushes 502 and 504 used for post-CMP cleaning of a wafer in accordance with one embodiment of the present invention. A brush gap 506 between the two PVA brushes 502 and 504 is designed to be adjustable by using a step motor 508 to move the two PVA brushes 502 and 504. Though not shown, it is understood that a wafer will be placed between the two PVA brushes 502 and 504 during actual cleaning. A controller, which is not shown in the figure, is used to control a step motor 508 to create an automatic feed-forward rotation-controller. The brush gap 506 is designed to control the speed of the rotation by tightening the PVA brushes 502 and 504, thereby creating friction, when rotation speed is too high, and loosening the PVA brushes 502 and 504, thereby reducing friction, when it is too slow. Along with the optical encoder of FIG. 3 that is implemented with the dummy roller of FIG. 2A, the rotation speed can be determined and sent to a signal process control board, or the controller where it decides if the rotation of the wafer is fast, slow, or normal and if the brush gap 506 needs to be adjusted. The controller is pre-programmed with an algorithm to determine how much action the step motor 508 should take. For example, if the rotation speed is too fast where a speed feedback over the algorithm setting is greater than 30%, the controller will make the step motor 508 tighten the brush gap 506 by 2 mm. If the rotation speed is slightly faster than normal where the speed feedback over the algorithm setting is greater than 15% and less than 30%, the brush gap 506 will be tightened by 1 mm. If the rotation speed is normal where the speed feedback over the algorithm setting is less than 15% while a speed feedback under the algorithm setting is also less than 15%, no action will be taken and the brush gap 506 will not change. If the rotation speed is slightly slower where the speed feedback under the algorithm setting is between 15% and 30%, the step motor 508 will loosen the brush gap 506 by 1 mm. If the rotation speed is too slow where the speed feedback under the algorithm setting is over 30%, the brush gap 506 will be loosened by 2 mm.

With this automatic feed-forward rotation-controller, the rotation speed of the wafer 506 can be controlled and the margin of error is lessened, thereby improving the reliability of the brush module. With accurate measurements of the rotation speed and direction from the dummy roller and the optical encoder and the implementation of the step motor to control the speed of the rotation of the wafer, a higher number of the unwanted particles can be removed in the clean-up process.

Specifically, an extra dummy roller and a set of optical encoders are implemented in this new design for making measurements of the rotation speed and direction of the wafer. The measurements can then be used by a control board to control a step motor that would adjust the width of the gap between the two PVA brushes so the rotation speed of the wafer can be controlled.

The above illustration provides many different embodiments or embodiments for implementing different features of the invention. Specific embodiments of components and processes are described to help clarify the invention. These are, of course, merely embodiments and are not intended to limit the invention to that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims.

Accordingly, it is appropriate that the appended claims be construed broadly and in a manner consistent with the scope of the invention, as set forth in the following claims.

What is claimed is:

1. A system for cleaning a wafer after chemical mechanical polish comprising:
    a brush module having at least two brushes arranged adjacent to each other for placing the wafer in between; and
    a dummy roller for contacting an edge of the wafer and following a rotation of the wafer,
    wherein when the wafer is rotated, the brushes clean both sides of the wafer, and the dummy roller is configured to detect a rotation speed and a rotation direction of the wafer for further adjusting the rotation of the wafer, the dummy roller further providing feedback so that the wafer rotation status can be measured in real time, and
    wherein the dummy roller comprises a set of high-speed bearings for accurate measurement of the rotation speed of the wafer by minimizing a start torque of the dummy roller.

2. The system of claim 1, further comprising:
    a set of roller caps;
    a roller motor; and
    a timing belt, wherein the wafer is rotated by the set of roller caps controlled by the roller motor via the timing belt.

3. The system of claim 2, further comprising a rotation-controller for controlling the roller motor.

4. The system of claim 3, wherein each roller cap further includes a trench for securing the wafer therein.

5. The system of claim 4, wherein a width of the trench is about a thickness of the wafer with an additional predetermined space for rotating the wafer.

6. The system of claim 5, wherein the width of the trench is about 0.8 mm.

7. The system of claim 1, wherein the dummy roller further includes an optical encoder for detecting the rotation speed and rotation direction of the wafer.

8. The system of claim 7, wherein the optical encoder further includes:
    at least a first optical sensor for transmitting and receiving a first light and a second optical sensor for transmitting and receiving a second light;
    a light interdict plate placed close to the first and the second optical sensors having a set of trenches thereon; and
    wherein the rotation direction and rotation speed of the wafer are detected by receiving the first and the second lights bouncing off the light interdict plate when the set of trenches are sensed during a rotation of the light interdict plate.

9. The system of claim 8, wherein the first and the second optical sensors are 90 degrees out of phase.

10. The system of claim 1, wherein the brush module and the wafer are arranged in a vertical orientation, wherein the dummy roller is placed in the lower right corner of the brush module.

11. The system of claim 2, wherein the brush module and the wafer are arranged in a horizontal orientation, wherein the dummy roller is placed between two roller caps of the set of the roller caps.

12. The system of claim 11 further comprises a step motor and a rotation-controller pre-programmed with an algorithm to control the step motor based on the rotation speed and rotation direction of the wafer.

* * * * *